(12) United States Patent
Nagata et al.

(10) Patent No.: US 7,935,262 B2
(45) Date of Patent: May 3, 2011

(54) METHOD OF MANUFACTURING FINE PATTERNS

(75) Inventors: Yoshihide Nagata, Kanagawa (JP); Atsushi Sato, Kanagawa (JP); Hitomu Watanabe, Kanagawa (JP); Ji Woo Kim, Yongin-si (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 826 days.

(21) Appl. No.: 11/987,067

(22) Filed: Nov. 27, 2007

(65) Prior Publication Data
US 2008/0121610 A1 May 29, 2008

(30) Foreign Application Priority Data
Nov. 28, 2006 (JP) ................. 2006-319758

(51) Int. Cl.
*C23F 1/00* (2006.01)
(52) U.S. Cl. .......................... 216/11; 216/95
(58) Field of Classification Search .............. None
See application file for complete search history.

(56) References Cited

U.S. PATENT DOCUMENTS

| | | | | |
|---|---|---|---|---|
| 4,533,430 | A * | 8/1985 | Bower | 438/695 |
| 4,793,825 | A * | 12/1988 | Benjamin et al. | 604/891.1 |
| 4,888,300 | A * | 12/1989 | Burton | 438/404 |
| 5,629,579 | A * | 5/1997 | Zimmerman | 313/309 |
| 5,719,073 | A * | 2/1998 | Shaw et al. | 438/53 |
| 5,926,721 | A * | 7/1999 | Hong et al. | 438/413 |
| 6,093,330 | A * | 7/2000 | Chong et al. | 216/2 |
| 6,180,480 | B1 * | 1/2001 | Economikos et al. | 438/386 |
| 6,307,247 | B1 * | 10/2001 | Davies | 257/522 |
| 6,534,913 | B1 * | 3/2003 | Perrin et al. | 313/497 |
| 6,617,222 | B1 * | 9/2003 | Coursey | 438/398 |
| 6,670,257 | B1 * | 12/2003 | Barlocchi et al. | 438/422 |
| 6,779,247 | B1 * | 8/2004 | Murari et al. | 29/603.01 |
| 7,202,127 | B2 * | 4/2007 | Busch et al. | 438/253 |
| 7,393,741 | B2 * | 7/2008 | Sandhu et al. | 438/244 |
| 7,400,024 | B2 * | 7/2008 | Kunnen | 257/511 |
| 7,771,790 | B2 * | 8/2010 | Faguet | 427/248.1 |
| 7,825,451 | B2 * | 11/2010 | Manning | 257/306 |
| 2002/0086479 | A1 * | 7/2002 | Reinberg | 438/239 |
| 2002/0098654 | A1 * | 7/2002 | Durcan et al. | 438/267 |
| 2003/0227044 | A1 * | 12/2003 | Park | 257/301 |
| 2004/0197843 | A1 * | 10/2004 | Chou et al. | 435/7.92 |
| 2005/0079721 | A1 * | 4/2005 | Buerger et al. | 438/696 |
| 2005/0205414 | A1 * | 9/2005 | Ngan et al. | 204/192.15 |
| 2007/0048976 | A1 * | 3/2007 | Raghu | 438/478 |
| 2008/0024873 | A1 * | 1/2008 | Kim et al. | 359/642 |
| 2009/0176365 | A1 * | 7/2009 | Mathew et al. | 438/622 |

FOREIGN PATENT DOCUMENTS

JP 2000-241615 9/2000

* cited by examiner

*Primary Examiner* — Allan Olsen
(74) *Attorney, Agent, or Firm* — Lee & Morse, P.C.

(57) ABSTRACT

A method of manufacturing fine patterns includes providing a base portion having a plurality of protruding portions with recess portions therebetween, depositing a material layer on the protruding portions, the material layer including grooves in an upper surface thereof and a plurality of material portions on respective protruding portions, the material portions being in direct contact with adjacent material portions to form contact surfaces therebetween and to overhang corresponding recess portions between the adjacent material portions, and wet etching the material portions through the grooves and contact surfaces to form pattern portions.

20 Claims, 9 Drawing Sheets

TABLE 1

| | Pitch p [nm] | Distance d [nm] | Height t [nm] | Aspect Ratio t/d | Deposition angle | Deposition Thickness [nm] | Groove Shape | Metal in Recess Portions | Pattern Portions |
|---|---|---|---|---|---|---|---|---|---|
| Example 1 | 200 | 100 | 150 | 1.5 | random | 50 | ○ | No | ○ |
| Example 2 | | | | | 60 | 300 | ○ | No | ○ |
| Example 3 | | | | | 60 to 20 | | ◎ | No | ○ |
| Example 4 | | | | | (-20) to (-60) | | ○ | No | ◉ |
| Comparative Example 1 | 400 | 200 | 300 | 1.5 | 60 | 300 | ○ | N/A | X |
| Comparative Example 2 | 200 | 100 | 150 | 1.5 | 60 to 20 | 100 | X | N/A | X |
| Comparative Example 3 | | | | | (-10) to 10 | 200 | X | N/A | X |
| Comparative Example 4 | | | | | 60 to 20 | 450 | X | N/A | X |

METHOD OF MANUFACTURING FINE PATTERNS

BACKGROUND OF THE INVENTION

1. Field of the Invention

Embodiments of the present invention relate to a method of manufacturing fine patterns.

2. Description of the Related Art

Conventional methods of forming wiring patterns having a reduced pitch may include, e.g., combined lithography and dry etching techniques. For example, metal thin films and resist may be sequentially formed on a substrate, followed by patterning of the resist by electron beam (EB) lithography, light lithography, e.g., ArF excimer laser lithography, and so forth. Next, exposed portions of the metal thin films may be etched by dry etching through the resist, followed by removal of the resist to yield fine patterns. However, the conventional method of combining lithography and dry etching may require a complex manufacturing process including a relatively large number of steps, thereby reducing overall yield and increasing manufacturing costs.

In another example, metal patterns may be formed by coating a resist on a metal film, patterning the resist with ultraviolet light, and using wet etching to remove portions of the metal film exposed through the resist, so portions of the metal film covered by the resist may form a desired pattern. However, use of wet etching may decrease control, thereby forming inaccurate wiring patterns.

SUMMARY OF THE INVENTION

Embodiments of the present invention are therefore directed to a method of forming fine patterns, which substantially overcomes one or more of the disadvantages of the related art.

It is therefore a feature of an embodiment of the present invention to provide a method of manufacturing fine patterns by wet etching a material layer through grooves in an upper surface thereof.

At least one of the above and other features and advantages of the present invention may be realized by providing a method of manufacturing fine patterns, including providing a base portion having a plurality of protruding portions with recess portions therebetween, depositing a material layer on the protruding portions, the material layer including grooves in an upper surface thereof and a plurality of material portions on respective protruding portions, the material portions being in direct contact with adjacent material portions to form contact surfaces therebetween and to overhang corresponding recess portions between the adjacent material portions, and wet etching the material portions through the grooves and contact surfaces to form pattern portions.

The grooves may correspond to the contact surfaces. A width of the pattern portions may substantially equal a width of respective protruding portions. The grooves may be formed to be V-shaped. Vertices of grooves may be at respective contact surfaces of adjacent material portions. Depositing the material layer may include forming small openings through contact surfaces of adjacent material portions. The method may further include accelerating separation between adjacent material portions before and/or during the wet etching. Accelerating separation may include exerting an external force on the protruding portions. The external force may include one or more of mechanical stress and/or thermal stress.

Depositing the material layer may include deposition at an angle with respect to a normal to the base portion. Depositing the material at an angle may include deposition at a constant angle other than 0°. Depositing the material at an angle may include deposition at a varying angle. Depositing the material at an angle may include deposition at an angle that varies from about 20° to about 60°. Depositing the material at an angle may include deposition at random angles. An aspect ratio of the recess portions may be about 1.5 or larger.

Depositing material on the protruding portions may include setting the protruding portions to a temperature below a melting point of the material. Depositing the material to form the plurality of material portions may include forming each material portion to have a width that increases in an upward vertical direction. The plurality of protruding portions may be formed to have outer surfaces having an etch selectivity with respect to the material. Depositing the material may include depositing metal. The plurality of protruding portions and the base portion may be integral with each other.

BRIEF DESCRIPTION OF THE DRAWINGS

The above and other features and advantages of embodiments of the present invention will become more apparent to those of ordinary skill in the art by describing in detail exemplary embodiments thereof with reference to the attached drawings, in which.

DETAILED DESCRIPTION OF THE INVENTION

Japanese patent application number 2006-319758, filed on Nov. 28, 2006, in the Japanese Patent Office, and entitled: "Method of Manufacturing Fine Metal Pattern," is incorporated by reference herein in its entirety.

Embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, an exemplary embodiment of fine patterns formed according to an embodiment of the present invention will be described more fully with reference to FIGS. 1-2. Fine patterns may refer, for example, to metal or other material patterns having a reduced pitch, e.g., several hundreds of nm or less. For example, the fine patterns formed according to an embodiment of the present invention may be a plurality of interconnect patterns, e.g., wiring of a semiconductor, a metal grid, a wiring of an optical element, and so forth.

Figure 1:
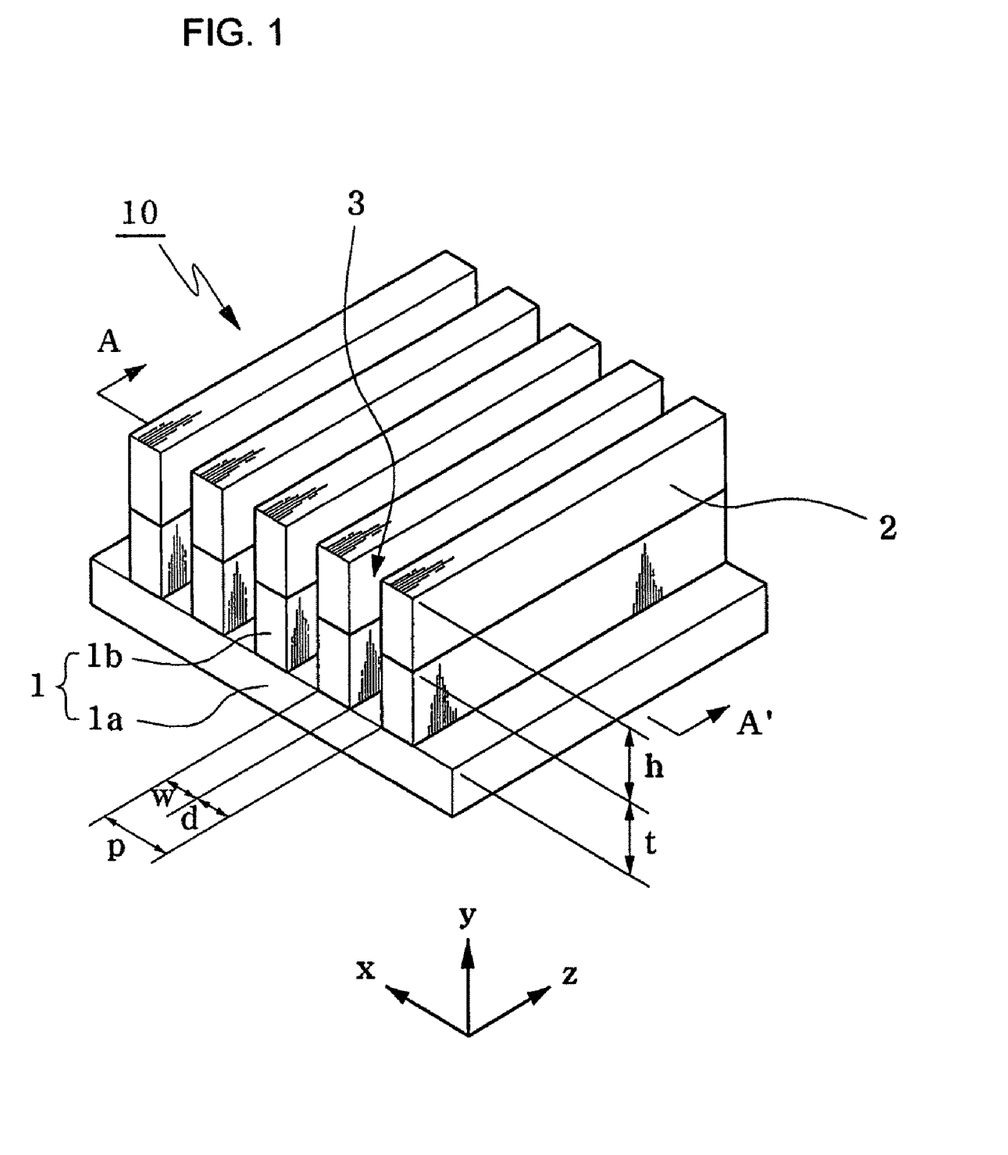
FIG. 1 illustrates a schematic perspective view of fine patterns manufactured according to an embodiment of the present invention.
Figure 2:
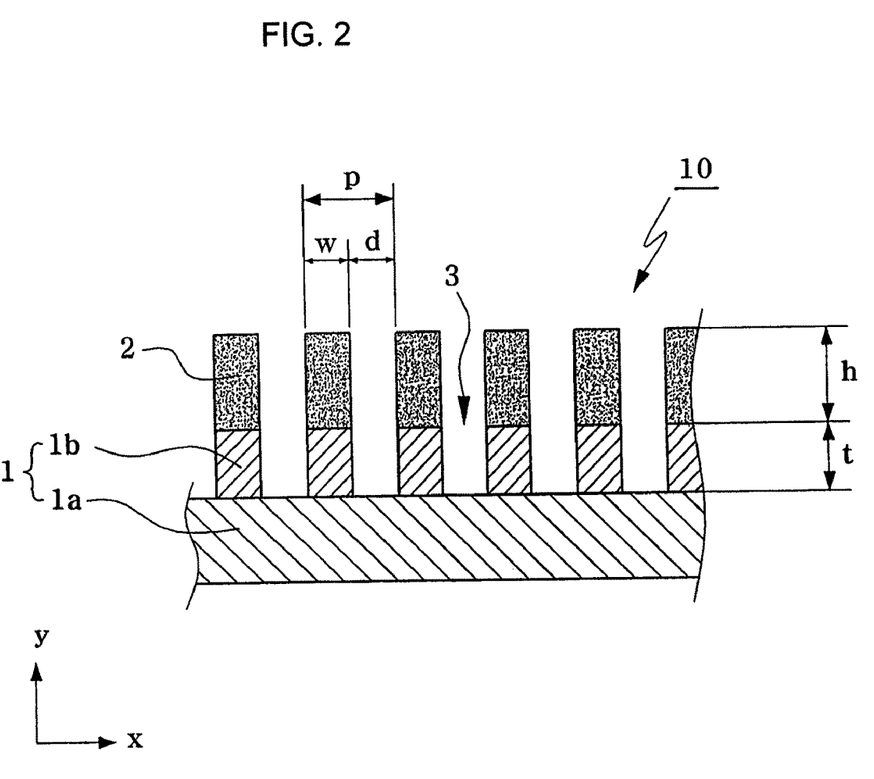
FIG. 2 illustrates a cross-sectional view along line A-A' of FIG. 1.

As illustrated in FIGS. 1-2, a pattern 10 may be formed on a substrate 1, and may include a plurality of pattern portions 2 having gaps 3 therebetween. The substrate 1 may include a flat-shaped, e.g., a plate-shaped or a film-shaped, base portion 1a in the xz-plane and a plurality of protruded portions 1b having a pitch p. As illustrated in FIGS. 1-2, each protruded portion 1b of the substrate 1 may extend along a first direction, i.e., along the z-axis, on the base portion 1a, and may have a height t, i.e., a distance as measured in an upward vertical direction from an upper surface of the base portion 1b along the y-axis. As further illustrated in FIG. 1, each protruded portion 1b may have a width W along a second direction, i.e., a horizontal distance as measured along the x-axis, and may be positioned at a distance d from an adjacent protruded portion 1b along the x-axis. The protruded portions 1b may have any suitable cross-section, e.g., rectangular, and may be substantially parallel to one another, so that the pitch p may substantially equal a sum of the width W of a single protruded portion 1b and the distance d between two adjacent protruded portions 1b. It should be noted, however, that other configurations of the protruded portions 1b, e.g., a grid-shaped pattern, a plurality of angled longitudinal lines, and so forth, are within the scope of the present invention, and therefore, the protruded portions 1b may be modified to adjust geometrical configuration, connection relation, distance d therebetween, and so forth.

The plurality of pattern portions 2 may be positioned on and overlap with respective protruded portions 1b, so each pattern portion 2 may have the width W, i.e., a substantially same width as a corresponding protruded portion 1b. As such, each gap 3 between two adjacent pattern portions 2 may have a width d, i.e., a width corresponding to the distance d between adjacent protruded portions 1b. Accordingly, the pattern portions 2 and the gaps 3 may form an alternating pattern, as illustrated in FIG. 2. Each pattern portion 2 may have a height h as measured from an upper surface of a corresponding protruded portion 1b in an upward direction.

It is noted, however, that FIG. 1 illustrates the protruded portions 1b and pattern portions 2 as having rectangular cross-sections and substantially same widths W for convenience only, and other configurations are within the scope of the present invention. If the pattern portions 2 are used in an optical element, e.g., a diffraction grating, the width W may be substantially constant in the height and extending directions. If the pattern portions 2 are used in a wiring pattern of a semiconductor, adjacent pattern portions 2 may be sufficiently spaced apart, i.e., the width d of the gaps 3 may be sufficiently large, so a potential short circuit between adjacent pattern portions 2 may be minimized, thereby facilitating larger ranges of width W of pattern portions 2, non-parallel positioning of the pattern portions 2, e.g., a zigzag configuration, and/or varied cross-sections, as compared to patterns of a diffraction grating.

The pattern portions 2 may be formed of any suitable material, as determined with respect to design and requirement specifications of the pattern 10. For example, the pattern portions 2 may be formed of metal, e.g., one or more of aluminum, copper, gold, and/or silver. In other implementations, the pattern portions may be formed of other materials, which may or may not contain metal. The pattern portions 2 may have a single-layer structure or a multi-layer structure.

Figure 3:
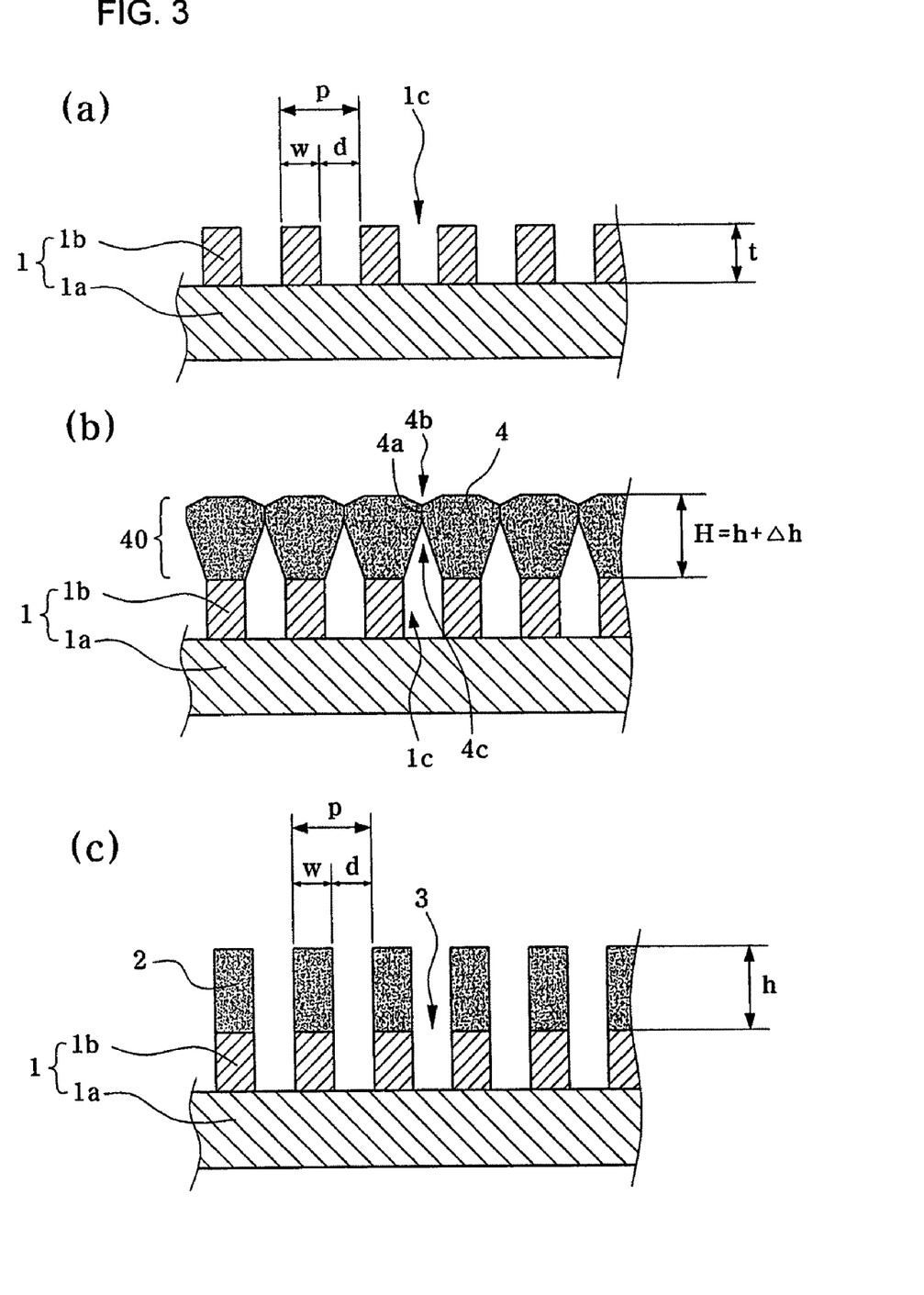
FIGS. 3a-3c illustrate cross-sectional views of sequential stages of manufacturing of the fine patterns of FIG. 2.
Figure 4:
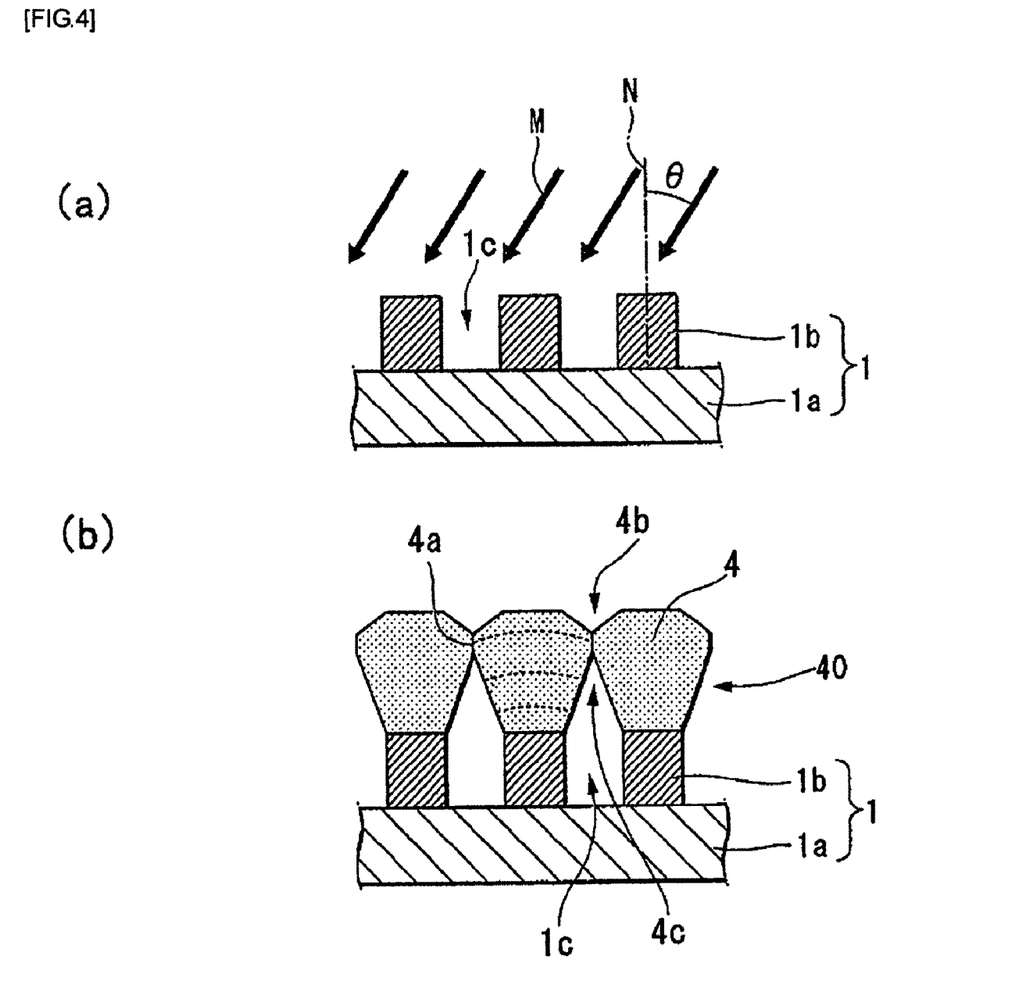
FIGS. 4a-4b illustrate cross-sectional views of stages in a method of depositing material on protruding portions of FIG. 3a according to an embodiment of the present invention.

Next, an exemplary embodiment of a method of manufacturing the patterns 10 according to the present invention will be described more fully with reference to FIGS. 3a-3c. It should be noted that FIGS. 3a-3c correspond to a cross-sectional view along line A-A' of FIG. 1.

First, as illustrated in FIG. 3a, the substrate 1 may be processed to form the protruded portions 1b on the base portion 1a. For example, the substrate 1 may be formed as a single body using, e.g., a mold, and/or portions thereof may be removed, e.g., etched, to form the protruded portions 1b with the width W and height t on the base portion 1a. In other words, the protruded portions 1b and the base portion 1a may be integral with each other. In another example, the protruded portions 1b may be, e.g., etched, of a different material than the base portion 1a. Formation of the protruded portions 1b may be performed by any suitable method, e.g., lithography, nanoimprint processing, and so forth. For example, if a nanoimprint processing is used, a mold having a fine structure may be pressed to a resist film on the substrate 1 to impart a pattern thereto, followed by, e.g., electron beam lithography, to transfer the mold pattern to the substrate 1, i.e., to form the protruded portions 1b. Accordingly, a plurality of vertical protruding lines may be formed on an upper surface of the base portion 1a of the substrate 1 with the pitch p. Recess portions 1c having the width d may be formed between the protruded portions 1b, as further illustrated in FIG. 3a. The nanoimprint processing may provide low cost and high throughput.

The substrate 1, i.e., base portion 1a and protruded portions 1b, may be formed of any suitable material capable of being coated, e.g., with a metal film, and exhibiting a different etch selectivity with respect to the coating material, e.g., a non-corroding material or a material treated for an anti-corrosion etch process. For example, if an optical element, e.g., a diffraction grating, is formed, a light-transmissive synthetic resin material may be employed, e.g., polyethylene terephthalate (PET), to form the substrate 1. If the protruding portions 1b are formed of a different material than the base portion 1a of the substrate 1, e.g., a poly methylmethacrylate (PMMA) based resin may be used to form the protruded portions 1b on PET base portion 1a.

The protruded portions 1b may be formed so that the distance d therebetween and height t thereof may provide a predetermined aspect ratio. In other words, the recess portions 1c may be formed to have a predetermined ratio between the height t and width d thereof, i.e., an aspect ratio t/d, so the predetermined aspect ratio is capable of substantially minimizing deposition of material in the recess portions 1c during formation of a film on the protruded portions 1b, as will be discussed in detail below with reference to FIGS. 3a-3b and 4a-4b. The aspect ratio of the recess portions 1c may depend on a formation method of the film, a thickness of the formed film, and so forth. If the width d and height t of the recess portions 1c are on a nano-scale, minimizing deposition of the material therein may also depend on additional factors, e.g., material particle diameter. The particle diameter may be smaller than the width d of the recess portion 1c, e.g., about 100 nm or less. The aspect ratio t/d of the recess portions 1c may be about 1.5 or larger.

For example, the width d of the recess portions 1c may be reduced with respect to the height t to increase the aspect ratio and minimize the pitch p of the protruded portions 1b. More specifically, if the pitch p is set to be equal to or smaller than about 200 nm and a line ratio, i.e., a ratio W/p, is set to range from about 0.2 to about 0.8, the width d of the recess portions 1c may range from about 40 nm to about 160 nm. The aspect ratio may be set to be equal to or greater than about 1.5. Preferably, the width d of the recess portions 1c may be equal to or smaller than about 100 nm, and the aspect ratio (t/d) may be equal to or greater than about 3. It should be noted, however, that even if the pitch p is greater than about 200 nm, and the line ratio is smaller than about 0.2 or greater than about 0.8, formation of the protruded portions 1b to have a sufficiently large aspect ratio t/d and at a predetermined deposition angle may be sufficient to substantially minimize deposition of material in the recess portions 1c, as will be discussed in detail below with reference to FIGS. 3a-3b and 4a-4b.

Next, as illustrated in FIG. 3b, a film 40 may be formed on the protruded portions 1b by using an oblique deposition, i.e., spraying of material from a deposition source onto the protruded portions 1b at a constant deposition angle θ other than 0° with respect to a normal to the base portion 1a of the substrate 1, as illustrated in FIGS. 4a-4b. In detail, as illustrated in FIG. 4a, a deposited material, e.g., aluminum, copper, gold, and/or silver, may be deposited on upper surfaces of the protruded portions 1b in a direction M, i.e., at an angle θ with respect to a normal N to the substrate 1, to form material portions 4 having a predetermined thickness on corresponding protruding portions 1b. Each material portion 4 may have a widening shape, so adjacent material portions 4 may extend horizontally along the x-axis to contact each other to completely overhang the recess portion 1c therebetween, thereby substantially minimizing or preventing deposition of material therein. The plurality of material portions 4 may be referred to as the film 40.

In an implementation, a temperature of the protruded portion 1b may be set at a predetermined temperature, i.e., a temperature below a melting point of the deposited material, so that the material sprayed onto the upper surfaces of the protruded portions 1b may stably grow thereon in, e.g., a cylindrical shape, to form the film 40. If the temperature of the protruded portions 1b is too low, the deposited material may exhibit poor adhesion to the upper surfaces of the protruded portions 1b. On the other hand, if the temperature of the protruded portions 1b is too high, the deposited material may fail to grow stably in a vertical direction. For example, the temperature may be set to be about 30% to about 50% of the melting point of the deposited material as measured at an absolute temperature. More specifically, if the deposited material is aluminum having a melting point of about 933 K (660° C.), the temperature of the protruded portions 1b may be set to be about 280 K to about 466 K, i.e., about 7° C. to about 193° C.

The deposition direction of the material may be adjusted, e.g., with respect to the aspect ratio of the protruding portions 1b, so that deposited material may be substantially deposited only on upper surfaces of the protruding portions 1b. More specifically, since the deposition direction is an oblique direction represented by a dashed line in FIG. 4B, a continued deposition may increase growth of each material portion 4 in an upward vertical direction along the y-axis and in a horizontal direction along the x-axis. As such, a width of each material portion 4 may increase as a thickness thereof increases along the y-axis. Adjusting, e.g., the deposition direction and aspect ratio of the recess portions 1c, may cause the upper surfaces of the protruded portions 1b to be in a spraying path of the deposition material, thereby preventing and/or substantially minimizing deposition of the material into bottom portions of the recess portions 1c. Additionally, growth of the material portions 4 may further block the spraying path of the deposition material. Thus, the film 40 may substantially grow on upper surfaces of the protruded portions 1b in a direction opposite to the deposition direction M, so deposition of material components in bottom portions of the recess portions 1c may be substantially minimized.

An increased growth of each material portion 4 in the horizontal direction may impart a generally polygonal shape thereto, e.g., an octagon having a larger upper width as compared to a lower width thereof, and may decrease a horizontal distance along the x-axis between adjacent material portions 4. Accordingly, portions of adjacent material portions 4 may be in direct contact with one another, as illustrated in FIG. 4b. That is, facing portions of lateral sides of adjacent material portions 4 may contact each other to form a contact surface 4a, and lateral, non-contacting surfaces of adjacent material portions 4, i.e., surfaces extending upward from the protruding portions 1b toward a common contact surface 4a, may converge in an upward direction toward their corresponding contact surface 4a to form an inverted V-shaped lower groove 4c, as further illustrated in FIG. 4b.

More specifically, adjacent material portions 4 may contact each other along the contact surface 4a, so a corresponding recess portion 1c therebetween may be covered. In other words, contact surfaces 4a may substantially block the recess portions 1c, so material deposition in a bottom portion of the recess portions 1c may be substantially minimized or prevented. Each contact surface 4a may be defined by an interface between two contacting portions of adjacent material portions 4, and may be of any suitable geometric shape as determined by the growth of the film 40, e.g., deposition rate of the material. For example, each contact surface 4a may be centered in the recess region 1c with respect to a horizontal axis, i.e., positioned at a substantially equal distance from each of the adjacent protruding portions 1b along the x-axis, as illustrated in FIG. 4b. However, other configurations of the contact surfaces 4a, e.g., a contact surface 4a off-center of the recess portion 1c, are within the scope of the present invention.

Deposition of the material may continue so a height of the contact surfaces 4a in an upward direction may increase along the y-axis. However, since the deposition of the material is oblique, an upper surface of each material portion 4 may be irregular, i.e., not parallel to the upper surface of the base portion 1a, so the width of each material portion 4 may decrease, as further illustrated in FIG. 4b. More specifically, since contact surfaces 4a are not aligned along the deposition direction, adhesion of the deposited material to portions of the upper surfaces of the material portions 4 immediately adjacent to the contact surfaces 4a may be minimized, thereby reducing width of each material portion 4 and forming inclined surfaces in direct contact with the contact surfaces 4a, as illustrated in FIG. 4b. In other words, portions of upper surfaces of adjacent material portions 4 may converge in a downward direction toward their corresponding contact surface 4a to form an upper groove 4b, as illustrated in FIG. 4b. The upper groove 4b may be V-shaped, and may have sides corresponding to the deposition direction. Vertices of respective upper and lower grooves 4b and 4c may be completely aligned with each other, and may be in contact with a respective contact surface 4a.

Further, small openings may be formed between the contact surfaces 4a. Maintaining a stable shape by setting the temperature of the substrate 1 to be within the predetermined temperature range may help form the small openings. More specifically, since small amounts of the material deposited between adjacent material portions 4 may be adhered non-uniformly to each other, miniature voids may be formed therebetween, thereby forming the small openings. In other words, the small openings may be formed between facing lateral surfaces of adjacent material portions 4 to have a non-uniform structure, e.g., small openings may have different three-dimensional shapes. The small openings may be continuous along the xz-plane, and may have a predetermined depth along the y-axis.

Deposition of the material may continue to form the film 40 to have a thickness of about H, wherein H=h+Δh, as illustrated in FIG. 4b. In other words, the thickness H of the film 40 may exceed the height h of the pattern portions 2 by a predetermined height, i.e., about Δh, to facilitate subsequent height adjustment, i.e., etching and processing thereof. For example, if the pitch p is about 200 nm, H may be about 300 nm and h may be about 150 nm.

Once formation of the film 40 is complete, the film 40 may be wet etched to form a plurality of pattern portions 2 with gaps 3 therebetween, as illustrated in FIG. 3c. More specifically, each material portion 4 of the film 40 may be wet etched to adjust its structure to form a respective pattern portion 2. The etching solution and its etching rate may be determined according to the material of the film 40. For example, the etching solution may be a low-concentration etching solution, and may be used at a relatively low rate to substantially minimize and/or prevent detachment of the film from the protruding portions 1b due to reduced adhesion therebetween. The etching rate may be adjusted to provide a suitable pattern shape. For example, since an etching rate is higher under acidic conditions, the etching may be performed slowly under alkaline conditions. It should be noted, however, that "performed slowly" refers to etching not exceeding a length of about a few minutes.

More specifically, an upper surface of the film 40 may be submerged in the etching solution, e.g., potassium hydroxide (KOH), so the upper grooves 4b may be corroded to increase a depth thereof. That is, corrosion may proceed according to the irregularity of the upper surface of the film 40, i.e., through the upper grooves 4b. If the contact surfaces 4a include the small openings, the corrosion may be performed therethrough. That is, the etching solution may spread from the upper surfaces of the film 40 through the upper groves 4b and into the small openings between the contact surfaces 4a, so the structure of the small openings may facilitate corrosion of the material portions 4 through the meeting surfaces 4a by widening the small openings along the xz-plane and the y-axis. Widening of the small openings may form three-dimensional through-gaps, i.e., along the xz-plane and to a predetermined depth, to expose the recess portions 1c and portions of the upper surface of the base portion 1a of the substrate 1 to form gaps 3.

In other words, portions of the film 40 overlapping with the contact surfaces 4a may be removed, so each material portion 4 may be peripherally shaped, e.g., through the small openings, into a pattern portion 2 having the width W, i.e., a width corresponding to the width of the protruded portion 1b, as illustrated in FIG. 3c. Therefore, each gap 3 between adjacent material portions 4 may correspond to and overlap with a respective exposed recess portion 1c, so the pattern portions 2 may have the pitch p therebetween. The pattern portions 2 may have the height h. It should be noted that if a small amount of material is deposited in the recess portions 1c during deposition, the etching solution applied subsequently may remove such amounts. Once etching is complete, post-treatment may be performed to remove the etching solution and any remaining residues thereof.

Embodiments of the present invention may provide a method of manufacturing fine patterns by depositing a film on a plurality of protrusions with gaps therebetween, followed by wet etching of the film to form fine patterns corresponding to the protrusions. More specifically, while conventional wet-etching may require a mask on a film in order to etch the film isotropically into a 3-dimensional structure through the mask via a 2-dimensional opening, embodiments of the present invention may provide a plurality of protruded portions under a material layer, so the material layer is etched peripherally. That is, the material layer according to embodiments of the present invention may be formed to include a plurality of 3-dimensional structures, i.e., material portions 4, so each 3-dimensional structure may be contacted peripherally by an etching solution to form a pattern corresponding to a respective protruded portion.

Formation of the 3-dimensional structures may enhance etching accuracy in terms of shape, dimensions, and so forth, and may reduce manufacturing costs and increase yield due to the simplified manufacturing process, e.g., a reduced number of manufacturing steps, simplified equipment, and so forth. Further, even when the aspect ratio of the 3-dimensional structures is relatively large, good accuracy may be obtained by adjusting the 3-dimensional structures into a desired shape.

Figure 5:
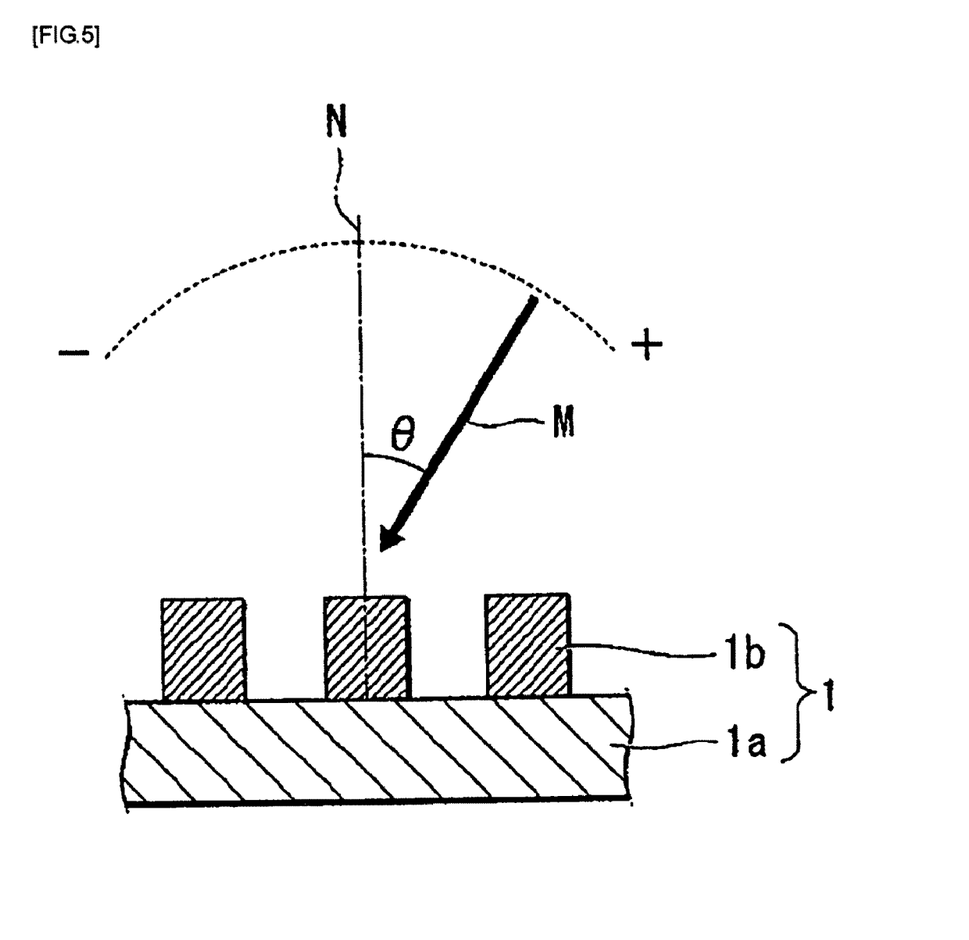
FIG. 5 illustrates a cross-sectional view of a of a stage in a method of depositing material on protruding portions of FIG. 3a according to another embodiment of the present invention.

According to another embodiment illustrated in FIG. 5, a method of forming fine patterns may be substantially similar to the method described previously with respect to FIGS. 1-4b, with the exception of continuously varying the deposition angle θ within a specified range.

More specifically, as illustrated in FIG. 5, the material may be deposited on the upper surfaces of the protruded portions 1b in a varying direction M. The range of the deposition angle θ may be continuously varied between an angle having a substantially small value and an angle having a substantially large value, e.g., the angle may be varied between about 20° to about 60°. When the deposition angle θ is substantially small, e.g., close to about 0°, the film formed on the protruded portions 1b may have a reduced porosity and an increased adhesion to the protruded portions 1b. When the deposition angle θ is substantially large, the upper grooves 4b may have an increased depth along the y-axis, thereby improving subsequent etching. Accordingly, continuously varying the deposition angle θ between a substantially small angle to a substantially larger angle may improve film density and thickness, increase adhesion between the pattern portions 2 and the protruded portions 1b, and improve the structure of the upper grooves 4b.

The variation range and direction may be set with respect to design requirements and specifications. For example, the initial deposition angle θ may be set to be substantially small to affect adhesion, and may be gradually increased to affect formation of the upper grooves 4b. In this respect, is it noted that a deposition angle may be either positive or negative. In other words, as illustrated in FIG. 5, a (+) sign refers to a positive direction, i.e., right side of the normal N, and the (−) sign refers to a negative direction, i.e., left side of the normal N. In another example, the deposition angle may be gradually decreased from a substantially large angle to a smaller angle, thereby forming the upper grooves 4b with smaller depth, i.e., flatter, as compared to upper grooves 4b formed by a deposition angle varying from a small value to a large one. It is further noted that when the deposition angle θ is about 0°, the upper grooves 4b may not be formed.

The embodiment illustrated in FIG. 5 may be advantageous in providing a continuously varied deposition angle θ, thereby substantially minimizing porosity of the film 40. A minimized porosity of the film 40 may exhibit enhanced adhesion between the pattern portions 2 and the protruded portions 1b, and may exhibit increased density, thereby improving electrical characteristics thereof. Further, the upper grooves 4b may have an improved structure, i.e., an increased depth along the y-axis, thereby facilitating subsequent etching of the material portions 4.

Figure 6:
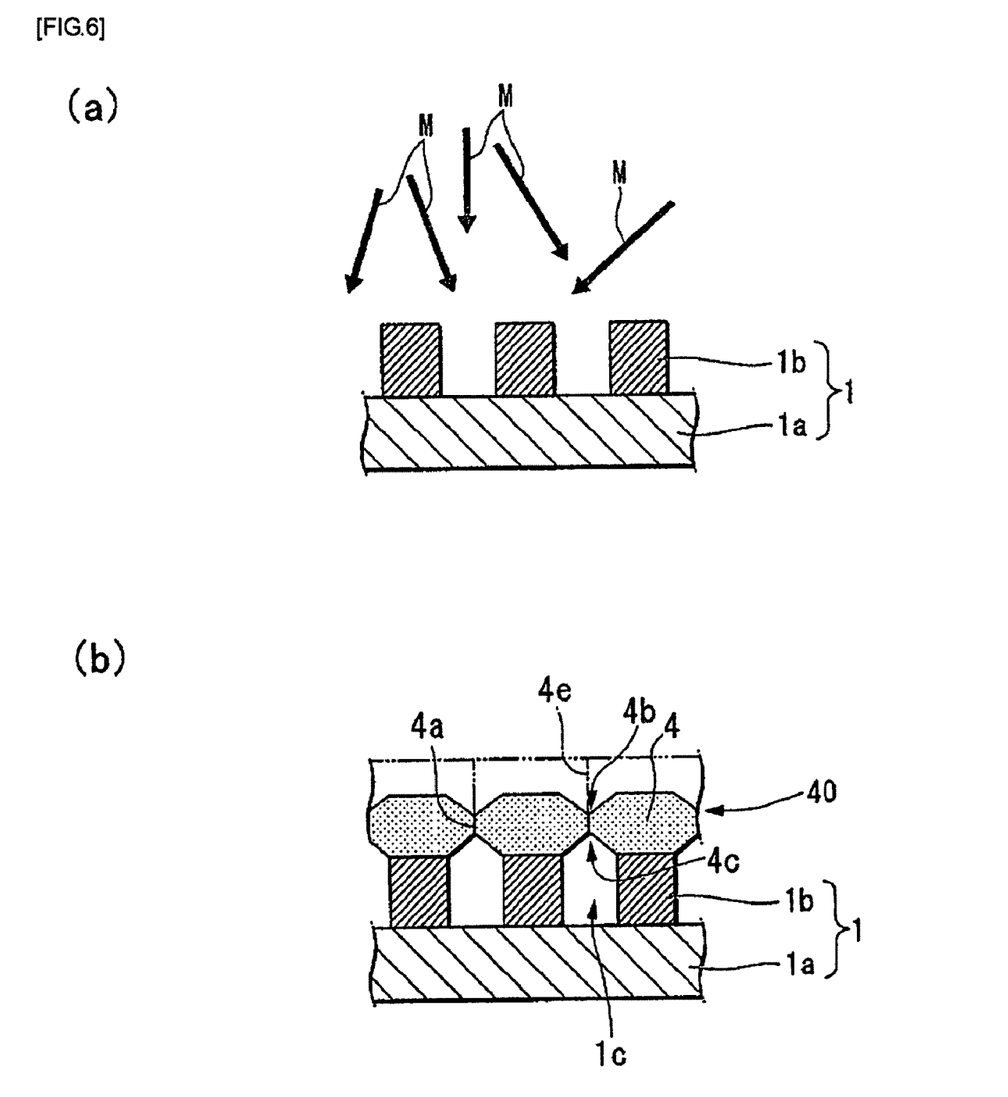
FIGS. 6a-6b illustrate cross-sectional views of stages in a method of depositing material on protruding portions of FIG. 3a according to another embodiment of the present invention.

According to yet another embodiment illustrated in FIGS. 6a-6b, a method of forming fine patterns may be substantially similar to the method described previously with respect to FIGS. 1-4b, with the exception of depositing and/or sputtering material onto the protruding portions 1b at a non-restricted deposition angle.

More specifically, as illustrated in FIG. 6a, the material may be deposited on the upper surfaces of the protruded portions 1b at random directions M, i.e., a non-restricted deposition angle. That is, the material may be dispersed randomly from a deposition source, and may reach the protruded portions 1b from various directions M in order to form the film 40 on the upper surfaces of the protruded portions 1b. Deposition of material on the protruded portions 1b from random directions may form the material portions 4 with an increased film growth along the horizontal direction, i.e., along the x-axis, and a reduced film growth along the vertical direction, i.e., along the y-axis.

Accordingly, each material portion 4 in FIGS. 6a-6b may be wider along the x-axis than the material portions 4 in FIGS. 4a-4b, and may be thinner along the y-axis than the material portions 4 in FIGS. 4a-4b. Thus, portions of the film 40 above the protruded portions 1b may be convex. Further, small deposition angles may minimize depth of the upper grooves 4b, thereby forming substantially flat upper grooves 4b between adjacent material portions 4, as illustrated by the dashed double-dotted lines 4e in FIG. 6b. Accordingly, thickness of the film 40 may be adjusted to have sufficient number of small openings in the contact surfaces 4a. In other words, deposition of material may be stopped before filling of the small openings in the contact surfaces 4a, so etching may be performed by penetrating the etching solution through the small openings in the contact surfaces 4a.

The film thickness of the film 40 in the embodiment illustrated in FIGS. 6a-6b may be determined according to distribution of the deposition angle and/or design requirements and specifications of the pattern portions 2, and may be thinner than the film 40 in FIGS. 4a-4b. For example, the thickness of the film 40 in the embodiment illustrated in FIGS. 6a-6b may be about 50 nm or smaller, as measured vertically in an upward direction from the upper surfaces of the protruded portions 1b to the upper-most point of the film 40. The embodiment illustrated in FIGS. 6a-6b may be advantageous in providing a film having a substantially reduced thickness and porosity and improved adhesion to the upper surfaces of the protruding portions 1b.

According to still another embodiment, a method of forming fine patterns may be substantially similar to the methods described previously with respect to FIGS. 1-6b, with the exception of using an external force on the film 40 before and/or during the etching process. In other words, an accelerated separation process may be performed to separate adjacent material portions 4 along the contact surfaces 4a therebetween. It should be noted that an "accelerated separation" refers to enlarging a space between adjacent material portions 4 by, e.g., cutting partial joint portions between adjacent material portions 4 along a respective contact surface 4a, increasing the width or number of the small openings in the contact surface 4a by separating contacting portions, and so forth. "Joint portions" may refer to non-continuous small amounts of material deposited in the small openings during the material deposition, thereby minimizing the size of the small openings. Formation of such joint portions may be increased when a small deposition angle is used. Separation of adjacent material portions 4 along the contact surfaces 4a may be advantageous to facilitate penetration of the etching solution therebetween, thereby increasing dimensional and structural accuracy of, e.g., the pattern portions, during etching.

A stress, e.g., an external force, may be exerted on the partial joint portions and/or the partial contacting portions between adjacent material portions 4, thereby facilitating movement and separation of the respective adjacent material portions 4 from each other. The external force may be a repetitive periodical force, an impact force, and/or a vibration force. For example, the external force may be a mechanical force applied to stretch or deform the substrate 1, so a relative position between adjacent protruded portions 1b changes, thereby separating the adjacent material portions 4 in an opposite direction with respect to a deposition direction. In another example, the external force may be a thermal stress applied to the substrate, e.g., heating or cooling, so a relative position between adjacent protruded portions 1b may change with respect to the adjacent material portions 4 as a result of different thermal expansion coefficients thereof, thereby separating the adjacent material portions 4 thereon in an opposite direction.

If a vibration force is used, a vibration source may transmit ultrasonic waves through a medium, e.g., air or an etching solution, to the substrate 1. An additional vibration may be performed at a resonance frequency to facilitate separation of adjacent material portions 4 from each other.

EXAMPLES

Four fine patterns were formed according to embodiments of the present invention, i.e., Examples 1-4, and were compared to patterns of Comparative Examples 1-4.

Example 1

A PET film having a thickness of 100 μm was used as a base portion, and a plurality of protruded portions were formed thereon of a PMMA-based resin via nanoimprint processing to complete the substrate. The protruded portions were formed to have a pitch of 200 nm therebetween, a height of 150 nm, and a width of 100 nm. The distance between adjacent protruded portions was 100 nm, so the aspect ratio of the recess portions between the protruded portions was 1.5.

Next, aluminum was deposited on the protruded portions from random directions, i.e., at a non-restricted angle, to form a film having a thickness of 50 nm. The film was etched with a 0.01 mol/L solution of KOH to form pattern portions corresponding to the protruded portions. No accelerated separation was used. Scanning electron microscope (SEM) photographs of cross-sectional views of the film and pattern portions, respectively, were taken to evaluate groove shapes, the amount of metal between protruded portions, and the cross-sectional structure.

Example 2

Pattern portions were formed according to a method substantially similar to the method of Example 1 with the exception of depositing aluminum at a constant deposition angle of 60° to form a film having a thickness of 300 nm.

Example 3

Figure 7:
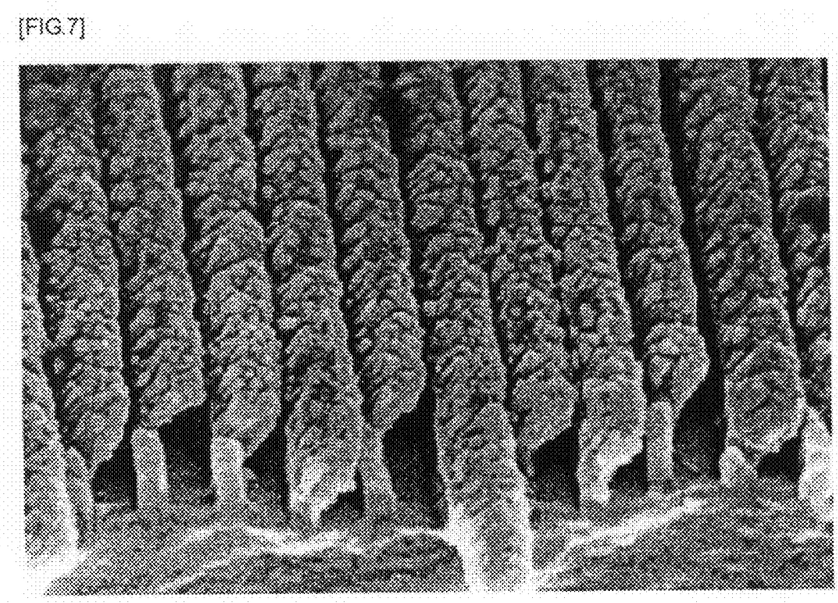
FIG. 7 illustrates a scanning electron microscope (SEM) photograph of a cross-sectional view of a material layer on a substrate according to an embodiment of the present invention.
Figure 8:
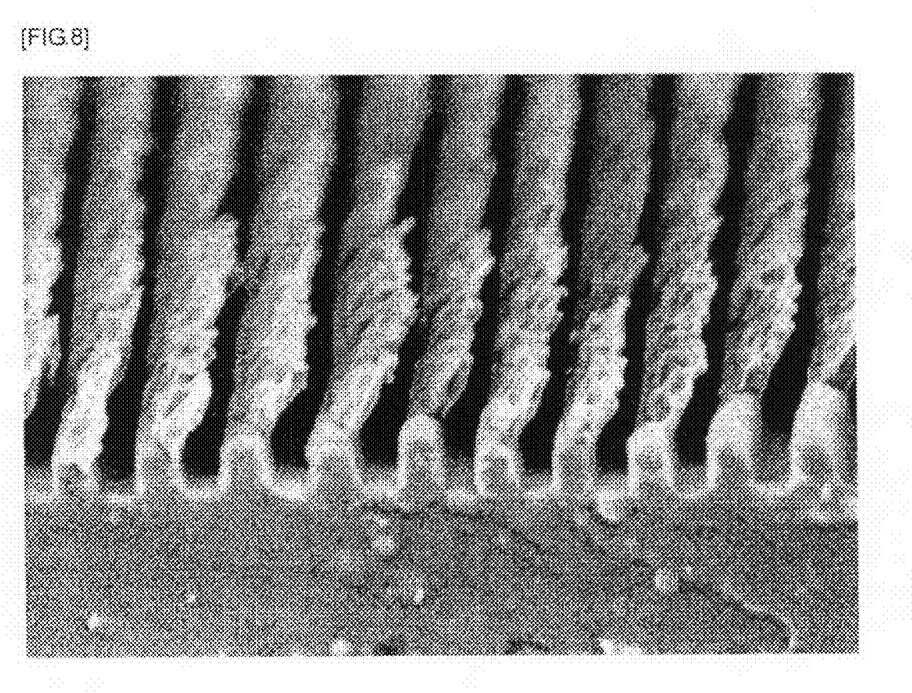
FIG. 8 illustrates a SEM photograph of a cross-sectional view of fine patterns on a substrate according to an embodiment of the present invention.

Pattern portions were formed according to a method substantially similar to the method of Example 2, with the exception of depositing the aluminum at a deposition angle continuously varying from 60° to 20°. For example, FIGS. 7-8 illustrate SEM photographs of cross-sections of the film and pattern portions formed therein, respectively, on the PET base portion in the xy-plane. FIG. 7 illustrates the film before wet etching, and FIG. 8 illustrates the pattern portions after wet etching.

Example 4

Pattern portions were formed according to a method substantially similar to the method of Example 3, with the exception of depositing the aluminum at a deposition angle continuously varying from (−20)° to (−60)°.

Comparative Example 1

Pattern portions were formed according to a method substantially similar to the method of Example 2, with the exception of forming the protruded portions to have a pitch of 400 nm and a height of 300 nm, and a distance between adjacent protruded portions of 200 nm.

Comparative Example 2

Pattern portions were formed according to a method substantially similar to the method of Example 3, with the exception of forming the film to have a thickness of 100 nm.

Comparative Example 3

Pattern portions were formed according to a method substantially similar to the method of Example 3, with the exception of depositing the aluminum at a deposition angle varying from (−10°) to 10°.

Comparative Example 4

Pattern portions were formed according to a method substantially similar to the method of Example 3, with the exception of depositing the aluminum to a thickness of 450 nm.

Examples 1-4 and Comparative Examples 1-4 were evaluated in terms of upper groove shapes, amount of between protruded portions, and cross-sections of gaps between the pattern portions. Results are reported in Table 1 illustrated in FIG. 9.

Groove shapes were evaluated, i.e., naked eye observation, by determining via the SEM photographs whether upper grooves, i.e., V-shaped grooves, were formed on the upper surface of the film. The grooves were classified as ⊚ (very good), ○ (good), or X (poor). Formation of grooves was determined as good or very good with respect to depth thereof. If the upper grooves were not formed, the evaluation was indicated as poor.

Metal between protruding portions was determined by evaluating the SEM photographs to determine whether any metal particles were deposited in the recess portions between the protruding portions. If metal particles were not found in or were removed from the recess portions by etching, the fine patterns were indicated as having "no" metal particles in the recess portions thereof.

The cross-sectional structure of the gaps between the pattern portions were evaluated by determining whether gaps were formed between adjacent pattern portions. The gaps were classified as ○ (good), i.e., a through-gap was formed between the protruding portions, ⊚ (very good), i.e., a through-gap having a rectangular cross section was formed between the protruding portions, and X (poor), i.e., pattern portions did not correspond to the protruded portions or adjacent pattern portions were in direct contact with each other.

Figure 9:
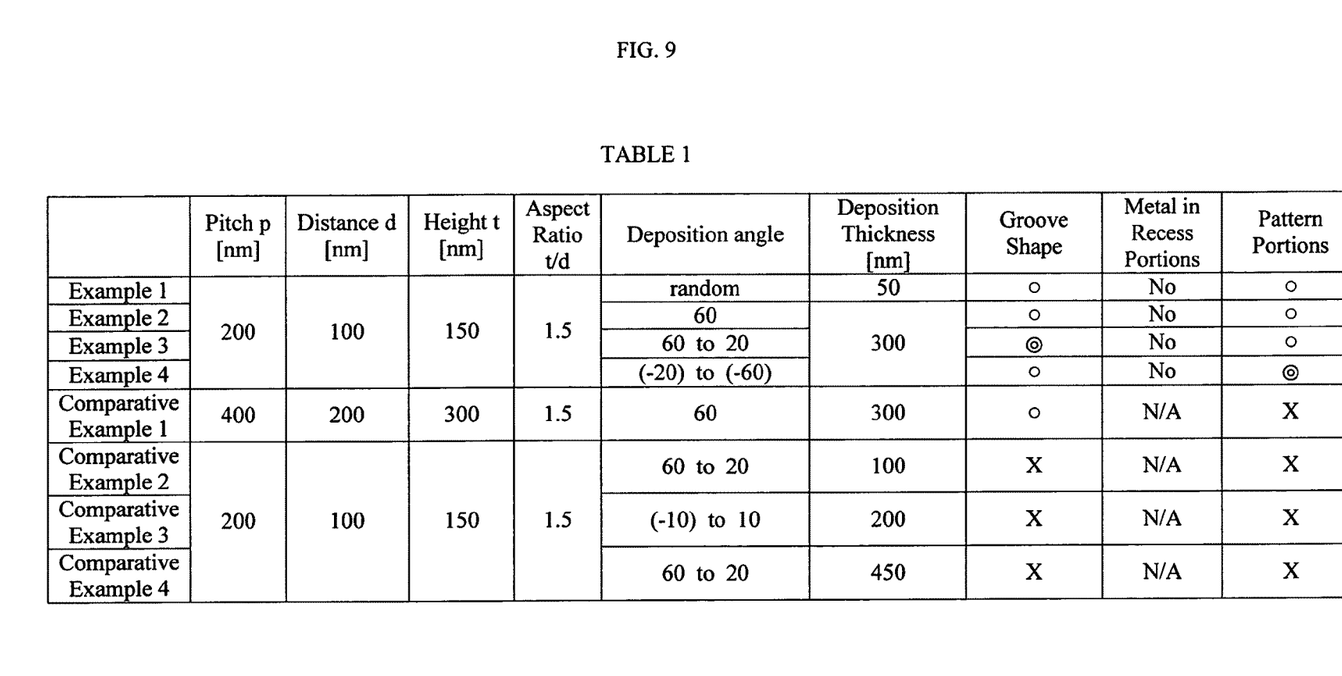
FIG. 9 illustrates Table 1 listing experimental results of Examples 1-4 and Comparative Examples 1-4.

As shown in Table 1 of FIG. 9, all the pattern portions formed according to embodiments of the present invention, i.e., Examples 1-4, exhibited ○ (good) or ⊚ (very good) groove shape, and "no" metal particles in the recess portions. As a result, as further illustrated in Table 1, the "cross-section of metal pattern" of each of Examples 1-4 was ○ (good) or ⊚ (very good).

It is noted that in Examples 2-3 material portions were inclined toward the deposition direction due to the deposition angle, e.g., a deposition angle of 60° as an initial angle in Example 3. More specifically, as illustrated in FIG. 7, the material portions on the upper surfaces of the protruded portions 1b were formed at an oblique right-upward direction, so adjacent material portions were in direct contact with each other. Further, as illustrated in FIG. 8, contact surfaces of adjacent material portions were etched to form through-gaps having a substantially same width as the recess portions.

As further shown in Table 1, no gaps were formed in Comparative Examples 1-4 due to failure to form the upper grooves.

In Comparative Example 1, the large distance d caused metal deposition in the recess portions 1c, thereby failing to form the contact surfaces between adjacent material portions. Consequently, in the etching process, the metal film was corroded uniformly from the upper surfaces in a downward direction, thereby failing to form the pattern portions 2.

In Comparative Example 2, the reduced thickness failed to form the contact surfaces between adjacent material portions. Consequently, in the etching process, the metal film was corroded uniformly from the upper surfaces in a downward direction, thereby failing to form the pattern portions 2.

In Comparative Example 3, the small deposition angle caused blocking of the upper grooves and the small openings in the contact surfaces. Consequently, in the etching process, the metal film was corroded uniformly from the upper surfaces in a downward direction, thereby failing to form the pattern portions 2.

In Comparative Example 4, the increased thickness caused blocking of the upper grooves and the small openings in the contact surfaces. Consequently, in the etching process, the metal film was corroded uniformly from the upper surfaces in a downward direction, thereby failing to form the pattern portions 2.

The method of manufacturing fine patterns according to embodiments of the present invention may include formation of a plurality of material portions in contact with one another, i.e., a metal film, on patterned fine prominences and depressions. Each material portion may be wet etched using a corresponding protruded portion as a mask to form a pattern portion. Thus, the pattern portions, i.e., final metal patterns, may be manufactured via a simplified, e.g., a reduced number of process steps, method, thereby improving productivity and reducing manufacturing costs.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing fine patterns, comprising:
   providing a base portion having a plurality of protruding portions with recess portions therebetween;
   depositing a material layer on the protruding portions, the material layer including grooves in an upper surface thereof and a plurality of material portions on respective protruding portions, the material portions being in direct contact with adjacent material portions to form contact surfaces therebetween and to overhang corresponding recess portions between the adjacent material portions; and
   wet etching the material portions through the grooves and contact surfaces to form pattern portions.

2. The method as claimed in claim 1, wherein the grooves correspond to the contact surfaces.

3. The method as claimed in claim 1, wherein a width of the pattern portions substantially equals a width of respective protruding portions.

4. The method as claimed in claim 1, wherein the grooves are formed to be V-shaped.

5. The method as claimed in claim 4, wherein a vertex of each groove is at a respective contact surface of adjacent material portions.

6. The method as claimed in claim 5, wherein depositing the material layer includes forming small openings through contact surfaces of adjacent material portions.

7. The method as claimed in claim 6, further comprising accelerating separation between adjacent material portions before and/or during the wet etching.

8. The method as claimed in claim 7, wherein accelerating separation includes exerting an external force on the protruding portions.

9. The method as claimed in claim 8, wherein the external force includes one or more of mechanical stress and/or thermal stress.

10. The method as claimed in claim 1, wherein depositing the material layer includes deposition at an angle with respect to a normal to the base portion.

11. The method as claimed in claim 10, wherein depositing the material at an angle includes deposition at a constant angle other than 0°.

12. The method as claimed in claim 10, wherein depositing the material at an angle includes deposition at a varying angle.

13. The method as claimed in claim 12, wherein depositing the material at an angle includes deposition at an angle that varies from about 20° to about 60°.

14. The method as claimed in claim 10, wherein depositing the material at an angle includes deposition at random angles.

15. The method as claimed in claim 10, wherein an aspect ratio of the recess portions is about 1.5 or larger.

16. The method as claimed in claim 1, wherein depositing material on the protruding portions includes setting the protruding portions to a temperature below a melting point of the material.

17. The method as claimed in claim 1, wherein depositing the material to form the plurality of material portions includes forming each material portion to have a width that increases in an upward vertical direction.

18. The method as claimed in claim 1, wherein the plurality of protruding portions are formed to have outer surfaces having an etch selectivity with respect to the material.

19. The method as claimed in claim 1, wherein depositing the material includes depositing metal.

20. The method as claimed in claim 1, wherein the plurality of protruding portions and the base portion are integral with each other.

* * * * *